United States Patent
Hui et al.

(10) Patent No.: US 11,728,829 B2
(45) Date of Patent: *Aug. 15, 2023

(54) ERROR DETECTION IN COMMUNICATION SYSTEMS USING POLAR CODED DATA TRANSMISSION

(71) Applicant: TELEFONAKTIEBOLAGET LM ERICSSON (PUBL), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

This patent is subject to a terminal disclaimer.

(21) Appl. No.: 17/717,344

(22) Filed: Apr. 11, 2022

(65) Prior Publication Data

US 2022/0231703 A1    Jul. 21, 2022

Related U.S. Application Data

(63) Continuation of application No. 16/346,284, filed as application No. PCT/IB2017/057057 on Nov. 10, 2017, now Pat. No. 11,303,300.

(Continued)

(51) Int. Cl.
*H03M 13/13* (2006.01)
*H03M 13/00* (2006.01)
(Continued)

(52) U.S. Cl.
CPC ........... *H03M 13/13* (2013.01); *H03M 13/09* (2013.01); *H03M 13/098* (2013.01);
(Continued)

(58) Field of Classification Search
CPC .... H03M 13/13; H03M 13/09; H03M 13/098; H03M 13/3738; H04L 1/0041;
(Continued)

(56) References Cited

U.S. PATENT DOCUMENTS 9,176,927 B2 * 11/2015 Gross .................. H03M 13/157
9,264,073 B2    2/2016 Malmirchegini
(Continued)

FOREIGN PATENT DOCUMENTS

WO    2016172940 A1    11/2016

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, pp. 3051-3073, Jul. 2009.
(Continued)

*Primary Examiner* — Justin R Knapp
(74) *Attorney, Agent, or Firm* — Sage Patent Group

(57) ABSTRACT

A method of decoding a polar coded signal includes determining channel reliabilities for a plurality of polar coded bit channels in a data communication system including a plurality of frozen bit channels and non-frozen bit channels, selecting a frozen bit channel, calculating a likelihood value for a bit estimate associated with the frozen bit channel, generating a hard decision value for the bit estimate in response to the likelihood value, comparing the hard decision value for the bit estimate to a known value of a frozen bit transmitted on the frozen bit channel, in response to determining that the hard decision value for the bit estimate differs from the known value of the frozen bit transmitted on the frozen bit channel, updating an accumulated uncertainty, comparing the accumulated uncertainty to a threshold, and determining that a decoding error has occurred in response to the comparison.

10 Claims, 11 Drawing Sheets

Related U.S. Application Data

(60) Provisional application No. 62/421,190, filed on Nov. 11, 2016.

(51) Int. Cl.
*H04L 1/00* (2006.01)
*H03M 13/09* (2006.01)
*H03M 13/37* (2006.01)
*H04L 1/20* (2006.01)

(52) U.S. Cl.
CPC ...... *H03M 13/3738* (2013.01); *H04L 1/0041* (2013.01); *H04L 1/0045* (2013.01); *H04L 1/0057* (2013.01); *H04L 1/0061* (2013.01); *H04L 1/0063* (2013.01); *H04L 1/208* (2013.01)

(58) Field of Classification Search
CPC ... H04L 1/0045; H04L 1/0057; H04L 1/0061; H04L 1/0063; H04L 1/208
See application file for complete search history.

(56) References Cited

U.S. PATENT DOCUMENTS

| | | |
|---|---|---|
| 9,317,365 B2 | 4/2016 | Alhussien |
| 9,819,361 B2 | 11/2017 | Shin |
| 2013/0117344 A1 | 5/2013 | Gross et al. |
| 2015/0333775 A1 | 11/2015 | Korb et al. |
| 2016/0056843 A1 | 2/2016 | Gross |

OTHER PUBLICATIONS

Huawai et al., "Evaluation of channel coding schemes for control channel", 3GPP TSG RAN WG1 Meeting #86b, R1-1608863, Lisbon, Portugal, Oct. 10-14, 2016.
Leroux, et. al., "A Semi-Parallel Successive-Cancellation Decoder for Polar Codes," IEEE Transactions on Signal Processing, vol. 61, No. 2, Jan. 15, 2013.
Tal et al., "List Decoding of Polar Codes", 2011 IEEE International Symposium on Information Theory Proceedings, 2011.

* cited by examiner

ERROR DETECTION IN COMMUNICATION SYSTEMS USING POLAR CODED DATA TRANSMISSION

RELATED APPLICATIONS

This is a Continuation of U.S. application Ser. No. 16/346,284, filed Apr. 30, 2019, which was a 371 of International Patent Application PCT/IB2017/057057, filed Nov. 10, 2017, which claims the benefit of U.S. Provisional Application No. 62/421,190, filed Nov. 11, 2016, the disclosures of which are all hereby incorporated by reference.

TECHNICAL FIELD

The disclosed subject matter relates generally to telecommunications.

Certain embodiments relate more particularly to telecommunications systems/methods that perform error detection in data transmitted using polar codes.

BACKGROUND

Polar codes, proposed by E. Arikan, "Channel Polarization: A Method for Constructing Capacity-Achieving Codes for Symmetric Binary-Input Memoryless Channels," IEEE Transactions on Information Theory, Vol. 55, Issue 7, pages 3051-3073, July 200, are the first class of constructive coding schemes that are provable to achieve the symmetric capacity of the binary-input discrete memoryless channels under a low-complexity successive cancellation (SC) decoder. However, the finite-length performance of polar codes under SC is not competitive compared to other modern channel coding schemes such as low-density parity-check (LDPC) codes and Turbo codes. Later, a SC list (SCL) decoder was proposed in I. Tal et al., "List Decoding of Polar Codes," 2011 IEEE International Symposium on Information Theory Proceedings, pages 1-5, Jul. 31-Aug. 5, 2011, which can approach the performance of optimal maximum-likelihood (ML) decoder. By concatenating a simple CRC coding, it was shown that the performance of concatenated polar code is competitive with that of well-optimized LDPC and Turbo codes. As a result, polar codes are being considered as a candidate for future wireless communication system (e.g., 5th generation, or 5G systems). Semi-parallel successive cancellation decoders are described in Leroux, et. al., "A Semi-Parallel Successive-Cancellation Decoder for Polar Codes," IEEE TRANSACTIONS ON SIGNAL PROCESSING, VOL. 61, NO. 2, Jan. 15, 2013.

Polar coding generally involves repeatedly transforming a pair of identical binary-input channels into two distinct channels of different qualities, one better and one worse than the original binary-input channel. By repeating such a pairwise polarizing operation M times on independent uses of a binary-input channel, a set of $N=2^M$ "bit-channels" of varying qualities can be obtained. As a result of coding applied to the transmitted bits, some of the bit-channels are nearly perfect (i.e. error free) while the rest of the bit-channels are nearly useless (i.e. totally noisy). Polar coding uses the nearly perfect channels to transmit data to the receiver while setting the input to the useless channels to have fixed or frozen values (e.g. 0), which are known to the receiver. For this reason, the input bits to the nearly useless channels are commonly referred to as frozen bits, while the input bits to the nearly perfect channels are referred to as non-frozen (or information) bits. Only the non-frozen bits are used to carry data in a polar code.

SUMMARY

A method of decoding a polar coded signal according to some embodiments includes determining channel reliabilities for a plurality of polar coded bit channels in a data communication system including a plurality of frozen bit channels and non-frozen bit channels, selecting a frozen bit channel of the plurality of frozen bit channels, calculating a likelihood value for a bit estimate associated with the frozen bit channel, generating a hard decision value for the bit estimate in response to the likelihood value, comparing the hard decision value for the bit estimate to a known value of a frozen bit transmitted on the frozen bit channel, in response to determining that the hard decision value for the bit estimate differs from the known value of the frozen bit transmitted on the frozen bit channel, updating an accumulated uncertainty, comparing the accumulated uncertainty to a threshold, and determining that a decoding error has occurred in response to the comparison of the accumulated uncertainty to the threshold.

The likelihood value may include a log likelihood value, LLR.

The method may further include repeating steps of: (a) selecting a frozen bit channel of the plurality of frozen bit channels, (b) calculating a likelihood value for a bit estimate associated with the frozen bit channel, (c) generating a hard decision value for the bit estimate in response to the likelihood value, (d) comparing the hard decision value for the bit estimate to a known value of a frozen bit transmitted on the frozen bit channel, and (e) in response to determining that the hard decision value for the bit estimate differs from the known value of the frozen bit transmitted on the frozen bit channel, updating an accumulated uncertainty, for each of a plurality of candidate decoding paths.

The method may further include discarding any candidate decoding path for which the accumulated uncertainty exceeds a predetermined threshold.

The method may further include determining any candidate decoding paths remain after discarding the candidate decoding paths, and in response to determining that no candidate decoding paths remain, aborting a decoding procedure.

Updating the accumulated uncertainty includes updating the accumulated uncertainty based on the reliability of the selected frozen bit channel and the likelihood value for the bit estimate according to the formula $$Z_p = Z_p + f(I_i, |LLR_{p,i}|)$$

where Zp may be the accumulated uncertainty, li may be the reliability of the selected frozen bit channel and LLRp,i may be the likelihood value for the bit estimate.

The value of $f(I_i, |LLR_{p,i}|)$ may be given by the equation $$f(I_i, |LLR_{p,i}|) = I_i \cdot |LLR_{p,i}|.$$

The value of $f(I_i, |LLR_{p,i}|)$ may be given by the equation $$f(I_i, |LLR_{p,i}|) = |LLR_{p,i}|.$$

In some embodiments, the value of $f(I_i, |LLR_{p,i}|)$ may be equal to li. In some embodiments, the value of $f(I_i, |LLR_{p,i}|)$ may be equal to a constant. In some embodiments, the value of $f(I_i, |LLR_{p,i}|)$ may be equal to one.

The method may further include aborting a decoding procedure in response determining that a decoding error has occurred.

The method may further include restarting a decoding procedure using a more powerful decoding algorithm in response determining that a decoding error has occurred.

The frozen bit may be a parity bit, and the method further include generating an expected parity value of the frozen bit based on a previously decoded bit estimate, and determining that a decoding error has occurred if the estimated value of the frozen bit does not correspond to the expected parity value of the frozen bit.

The method may further include discarding a current decoding path in response to determining that the estimated value of the frozen bit does not correspond to the expected parity value of the frozen bit.

Some embodiments provide a communication device operative to perform a method as described above.

Some embodiments provide a communication device including a decoding module for performing a method as described above.

Some embodiments provide a computer program for a communication device, the computer program including computer program code which when run in the communication device, causes the communication device to perform a method as described above.

A method of encoding a plurality of information bits in a polar encoder for transmission over a plurality of polar coded bit-channels according to some embodiments includes receiving a plurality of information bits, determining channel indices of a plurality of frozen bits among the plurality of bit-channels, generating a parity check bit, and assigning the parity check bit to one of the bit-channels corresponding to the plurality of frozen bits.

A value of the parity check bit may be determined based on values of one or more information bits assigned to bit-channels having lower channel indices than a bit-channel to which the parity check bit may be assigned.

Generating the parity check bit may include generating a plurality of parity check bits, and assigning the parity check bit to one of the bit-channels may include assigning the plurality of parity check bits to a plurality of bit-channels corresponding to the plurality of frozen bits.

Some embodiments provide a method in a polar decoder of decoding a plurality of information bits received over a plurality of polar coded bit-channels, the method including generating a soft value corresponding to a frozen bit, determining if the frozen bit may be a parity check frozen bit, generating a hard decision value for the parity check frozen bit, calculating an expected value of the parity check frozen bit, comparing the hard decision value for the parity check frozen bit, and determining that a decoding error has occurred based on determining that the hard decision value for the parity check frozen bit may be different from the expected value of the parity check frozen bit.

The method of may further include discarding a candidate decoding path for which the frozen bit was detected in response to determining that the hard decision value for the parity check frozen bit may be different from the expected value of the parity check frozen bit.

A method in a polar decoder of decoding a plurality of information bits received over a plurality of polar coded bit-channels according to some embodiments includes generating an estimated vector u of received information and frozen bits and likelihood values corresponding to the estimated vector u of received information and frozen bits, generating channel bit likelihood values based on the estimated information bit likelihood values, generating a first codeword by taking hard decisions from the channel bit likelihoods, re-encoding the estimated vector of received information to form a second codeword, comparing the first codeword and the second codeword, and determining whether a decoding error occurred in response to the comparison of the first codeword and the second codeword.

The method may further include discarding a candidate decoding path for which the first code word was generated in response to determining that a decoding error occurred.

A method in a polar decoder of decoding a plurality of information bits received over a plurality of polar coded bit-channels according to some embodiments includes generating an estimated vector u of received information and frozen bits and likelihood values corresponding to the estimated vector u of received information and frozen bits, generating channel bit likelihood values based on the estimated information bit likelihood values, generating a first codeword by taking hard decisions from the channel bit likelihoods, computing a syndrome of the first codeword, comparing the syndrome of the first codeword to an expected syndrome, and determining whether a decoding error occurred in response to the comparison of the syndrome of the first codeword and the expected syndrome.

The method may further include discarding a candidate decoding path for which the first code word was generated in response to determining that a decoding error occurred.

Some embodiments provide a communication device operative to perform a method as described above.

Some embodiments provide a communication device including a module for performing a method as described above.

Some embodiments provide a computer program for a communication device, the computer program including computer program code which when run in the communication device, causes the communication device to perform a method as described above.

BRIEF DESCRIPTION OF THE DRAWINGS

The drawings illustrate selected embodiments of the disclosed subject matter. In the drawings, like reference labels denote like features.

DETAILED DESCRIPTION

The following description presents various embodiments of the disclosed subject matter. These embodiments are presented as teaching examples and are not to be construed as limiting the scope of the disclosed subject matter. For example, certain details of the described embodiments may be modified, omitted, or expanded upon without departing from the scope of the disclosed subject matter.

Some embodiments provide methods of detecting block errors in polar decoding based on the values of the log likelihood ratios (LLRs) of the frozen bits.

In some embodiments, the signs of the values of the LLRs of the frozen bits may be used as a syndrome to determine if a decoding error has occurred.

Some embodiments detect codeword errors in polar decoding by comparing two estimated codewords associated with the information vector, where the two estimated codewords include an estimated received codeword and a re-encoded codeword.

Some embodiments detect codeword errors by examining a syndrome associated with the information vector.

Some or all of these embodiments may help to reduce the number of CRC bits that would otherwise be required to obtain a given level of error detection performance by utilizing error detection mechanisms of the polar decoder. Some embodiments may enable a polar decoder to declare a decoding error prior to completing the decoding of an entire block of bits, which may allow the decoder to more quickly take action to correct the decoding error, such as by starting over using a more powerful decoding algorithm.

Figure 1:
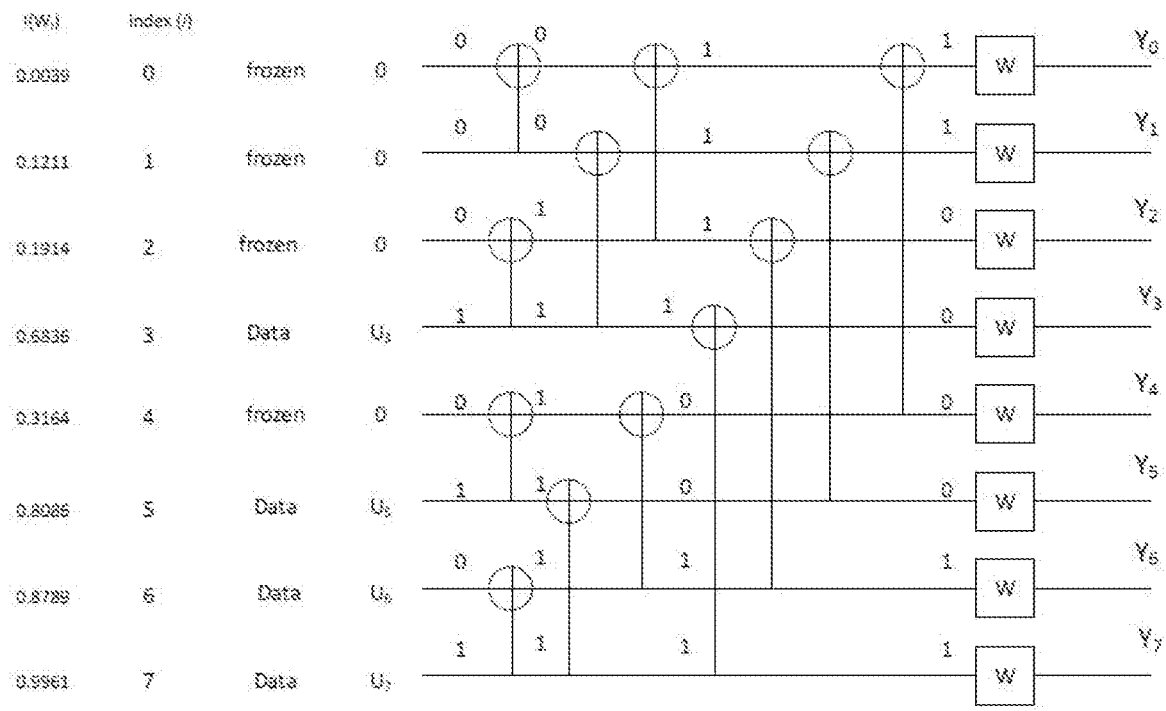
FIG. 1 shows an example of polar code structure with N=8.

An example illustrating the structure of a length-8 polar code is shown in FIG. 1. As shown therein, an 8-bit input data vector u is defined having values $u_0$ to $u_7$. The input data vector u includes both frozen and non-frozen bits. The same physical channel is divided by the polarization operation into 8 bit-channels which are assigned channel indices (I) of 0 through 7. In this example, the bits at positions $u_0$, $u_1$, $u_2$ and $u_4$ (corresponding to channel indices 0, 1, 2, and 4) are frozen bits that have been assigned a value of 0, while the bits at positions $u_3$, $u_5$, $u_6$ and $u_7$ (corresponding to channel indices 3, 5, 6, and 7) are non-frozen information bits.

The assignment of frozen or non-frozen bits to individual channels is based on the reliability of the channels. Each of the bit-channels has a reliability $I(W_i)$ that corresponds to the mutual information between the transmitted and received bit on the channel. That is, a low reliability indicates that the bit input to the bit-channel and the bit-output by the bit-channel are not highly correlated, while a high reliability indicates that the bit input to the bit-channel and the bit-output by the bit-channel are highly correlated. In this example, the channels having indices 0, 1, 2 and 4 have relatively low reliabilities, and therefore are assigned frozen bits, while the channels having indices 3, 5, 6 and 7 have relatively high reliabilities, and therefore are assigned information bits. In systems with a larger number of bit-channels, the differences between reliabilities of the bit-channels are typically more extreme than are shown in this example.

The frozen bits in a polar encoding/decoding system are fixed and known to both the transmitter and the receiver. In the example illustrated in FIG. 1, the frozen bits have the value of 0. The frozen bits may take other values, provided those values are known a priori to the receiver or can be calculated by the receiver. Some embodiments described below take advantage of this property to perform error detection.

As shown in FIG. 1, each bit location indexed by i is associated with a reliability of the corresponding bit-channel $W_i$. The reliability values may be the mutual information $I(W_i)$ between this bit and the received signals, as shown on the left side FIG. 1, or they may be the precomputed block error probability of the bit channel. These reliability values can be pre-determined for both the frozen bit locations and information bit locations. A high reliability value corresponds to a lower bit error probability when the associated bit location is used to carry information bit.

Figure 2:
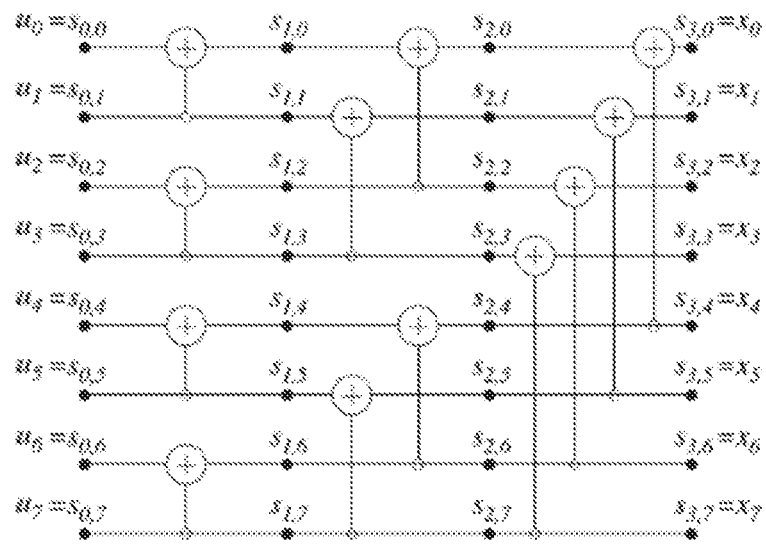
FIG. 2 shows an example of a polar code encoder with N=8.

FIG. 2 illustrates the intermediate information bits $s_{l,i}$ that are generated at each stage of the encoding process where $l \in \{0, 1, \ldots, n\}$ is the encoding stage or level and $i \in \{0, 1, \ldots, N-1\}$ is the channel index for polar encoding with N=8. Referring to FIGS. 1 and 2, the input data vector u, which in the example of FIG. 1 has the value [0 0 0 1 0 1 0 1], is input to an encoder that encodes the data through a series of XOR operations into intermediate information bits $s_{l,i}$. At the output of the encoding process, a transmission data vector x (corresponding to the intermediate information bits $s_{3,i}$ in this example) is obtained for transmission over a channel W. In the example of FIG. 1, the transmission data vector x has the value [1 1 0 0 0 0 1 1]. Since the same physical channel is used for each bit, the channel properties of each channel W are assumed to be identical. A vector y of values received over the channel W corresponding to the transmission data vector x has values $y=[y_0 \, y_1 \, y_2 \, y_3 \, y_4 \, y_5 \, y_6 \, y_7]$. The values $y_i$ of the received data vector y are used to calculate Log Likelihood Ratio (LLR) values that indicate probabilities that corresponding values of the transmission data vector x were transmitted. As will be appreciated, LLR values have both a magnitude and a sign, where the sign of the LLR value indicates the received symbol (e.g., a negative sign corresponds to a '1', while a positive sign corresponds to a '0') and the magnitude of the LLR value indicates the likelihood of such symbol being correct. Through the decoding process, the receiver generates estimates û of the input data vector u from the received values y.

The intermediate information bits $s_{l,i}$ are related by the following equations:

$$s_{l+1,i} = s_{l,i} \oplus s_{l,i+2^l}, \text{ if } \mod\left(\left\lfloor \frac{i}{2^l} \right\rfloor, 2\right) = 0, \quad [1]$$

$$s_{l+1,i} = s_{l,i} \text{ if } \mod\left(\left\lfloor \frac{i}{2^l} \right\rfloor, 2\right) = 1 \quad [2]$$

for $i \in \{0, 1, \ldots, N-1\}$ and $l \in \{0, 1, \ldots, n-1\}$, with $s_{0,i} \equiv u_i$ being the information bits, and $s_{n,i} \equiv x_i$ being the code bits at level n, for $i \in \{0, 1, \ldots, N-1\}$.

Figure 3:
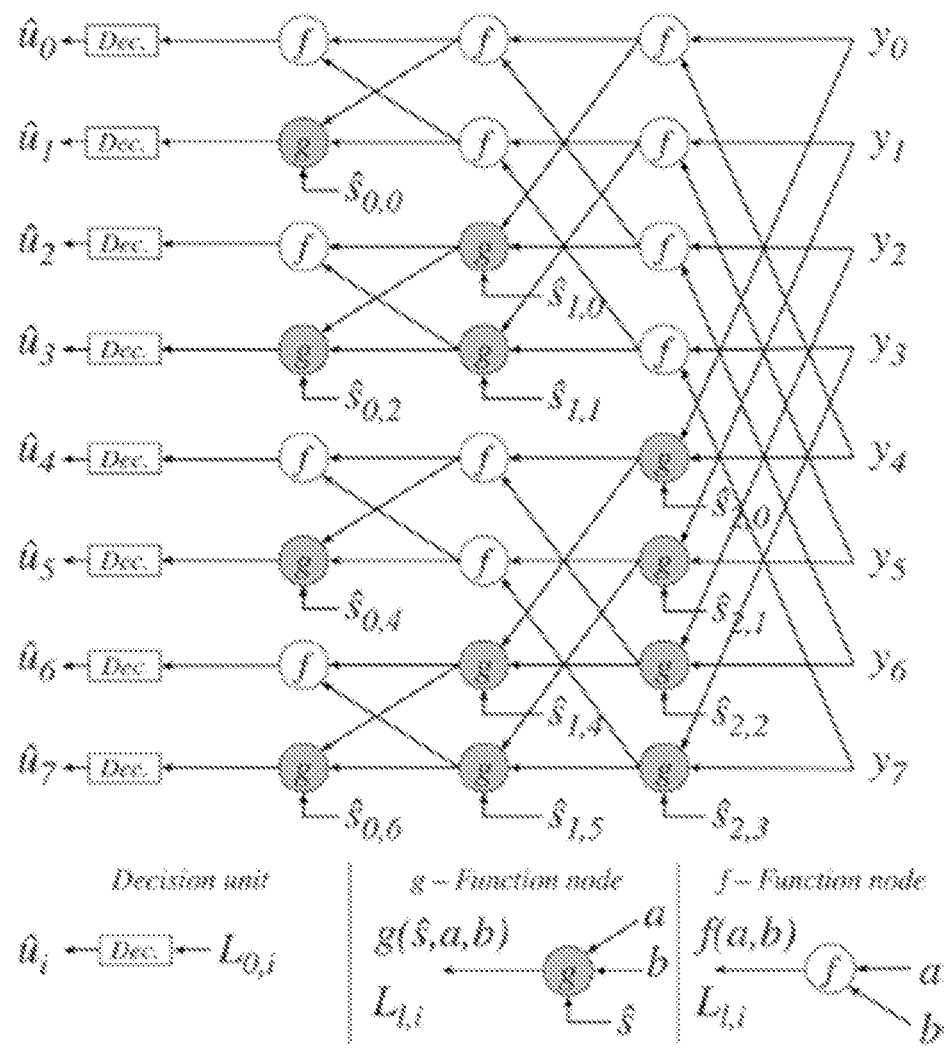
FIG. 3 shows an example of a butterfly-based SC decoder with N=8.

FIG. 3 illustrates a "butterfly" decoder that can be used to decode the polar coded information for the case of N=8. Messages passed in the decoder are Log Likelihood Ratio (LLR) values denoted as $L_{l,i}$, where l and i correspond to the decoder stage index and row index, respectively.

As noted above, the LLR values $L_{l,i}$ are characterized in that they have a magnitude and a sign. In addition, $L_{n,i}$ is the LLR at stage n (the first stage of the decoder) that is directly calculated from the channel output $y_i$. The basic components of the decoder are two functions given by the equations:

$$L_{l-1,i} = f(L_{l,i}, L_{l,i+2^l}) \triangleq 2 \tan h^{-1}(\tan h(L_{l,i}/2) \tan h (L_{l,i+2^l}/2)) \quad [3]$$

if B(l,i)=0

$$L_{l-1,i} = g(\hat{s}_{l,i-2^l}, L_{l,i}, L_{l,i-2^l}) \triangleq (-1)^{\hat{s}_{l,i-2^l}} L_{l,i-2^l} L_{l,i} \quad [4]$$

if B(l,i)=1 for $l \in \{0, 1, \ldots, n-1\}$ and $i \in \{0, 1, \ldots, N-1\}$, where B(l,i) denotes the lth significant bit in the binary representation of i, and where $\hat{s}_{l,i}$ denotes an estimate of the intermediate information bit $s_{l,i}$.

As can be seen in FIG. 3, the decoder uses the LLR values $L_{n,i}$ to calculate a soft decision value $L_{0,0}$ corresponding to bit index 0 using only the "f" function of equation [3] at function nodes 14-1 to 14-6. The soft decision value $L_{0,0}$ is processed by a decision block 12 to generate a bit estimate $\hat{u}_0$ for channel index 0. To generate the soft decision value $L_{0,1}$ which is used to generate a bit estimate $\hat{u}_1$ for channel index 1, the decoder uses both "f" functions and a "g" function at function node 14-7 that takes the intermediate information bit estimate $\hat{s}_0$ corresponding to the soft decision value $L_{0,0}$ as an input. Thus, the bit estimate $\hat{u}_1$ for channel index 1 is determined after the bit estimate $\hat{u}_0$ for channel index 0 is determined. Subsequent bit estimates are determined successively in a similar manner.

As each successive bit estimate is generated, the decoder generates two decoding paths corresponding to the two possible bit values, with each path having an associated probability of being correct. The decoder may keep a maximum of $L_{path}$ such paths in memory at any given time, keeping only the $L_{path}$ most likely decoding paths and discarding less likely decoding paths. When the decoder reaches the end of the data, the vector of estimates corresponding to the most likely decoding path is selected as the decoded data vector.

In certain embodiments of the disclosed subject matter, methods and/or apparatuses utilize aspects of polar coding/decoding to provide error detection. This error detection is based on the polar code construction itself, and not on CRC bits included in the transmitted information. An underlying principle of some embodiments is to try to detect errors based on the soft decoded values of the frozen bits before they are forced to the known hard values (typically zero) at the decision blocks 12 shown in FIG. 3. In some embodiments, the signs of the decoded soft frozen bit values at the inputs to the decision blocks 12 are used as a syndrome of the received block of coded bits. When a sufficient number of the signs of the decoded soft frozen bit values, especially for those associated with bit-channels having high reliabilities, are inconsistent with those of the known frozen bits, an error can be declared. This is because the decisions of information bits are related to the known values of the frozen bits. A set of correct decision on information bits should likely lead to a correct sign on the subsequent soft frozen bit values.

Certain embodiments may provide one or more potential benefits compared to conventional approaches, such as the following examples. The inherent error detection mechanism can be used by the polar decoder, so that the number of CRC bits can be reduced to lower overhead. The CRC bits are typically explicitly attached for error detection purpose.

In some embodiments, a decoding error can be declared before the end of the decoding process, which can allow a decoder to switch to a more robust decoding method earlier in the event of a decoding error.

Certain embodiments may also avoid various shortcomings associated with conventional approaches, such as the following examples. Existing polar decoder types include successive cancellation (SC), list decoding of SC (SCL), etc. For both SC and SCL, there is no mechanism to provide inherent error detection without relying on the CRC bits. In order to detect an errant block, some CRC bits need to be appended to the block of information bits before feeding them together into the polar decoder. This incurs additional overhead. As a result, it increases the coding rate at the encoder/decoder, and degrades the link performance for a given amount of transmission resources.

Error Detection Via Frozen Bits

Figure 4:
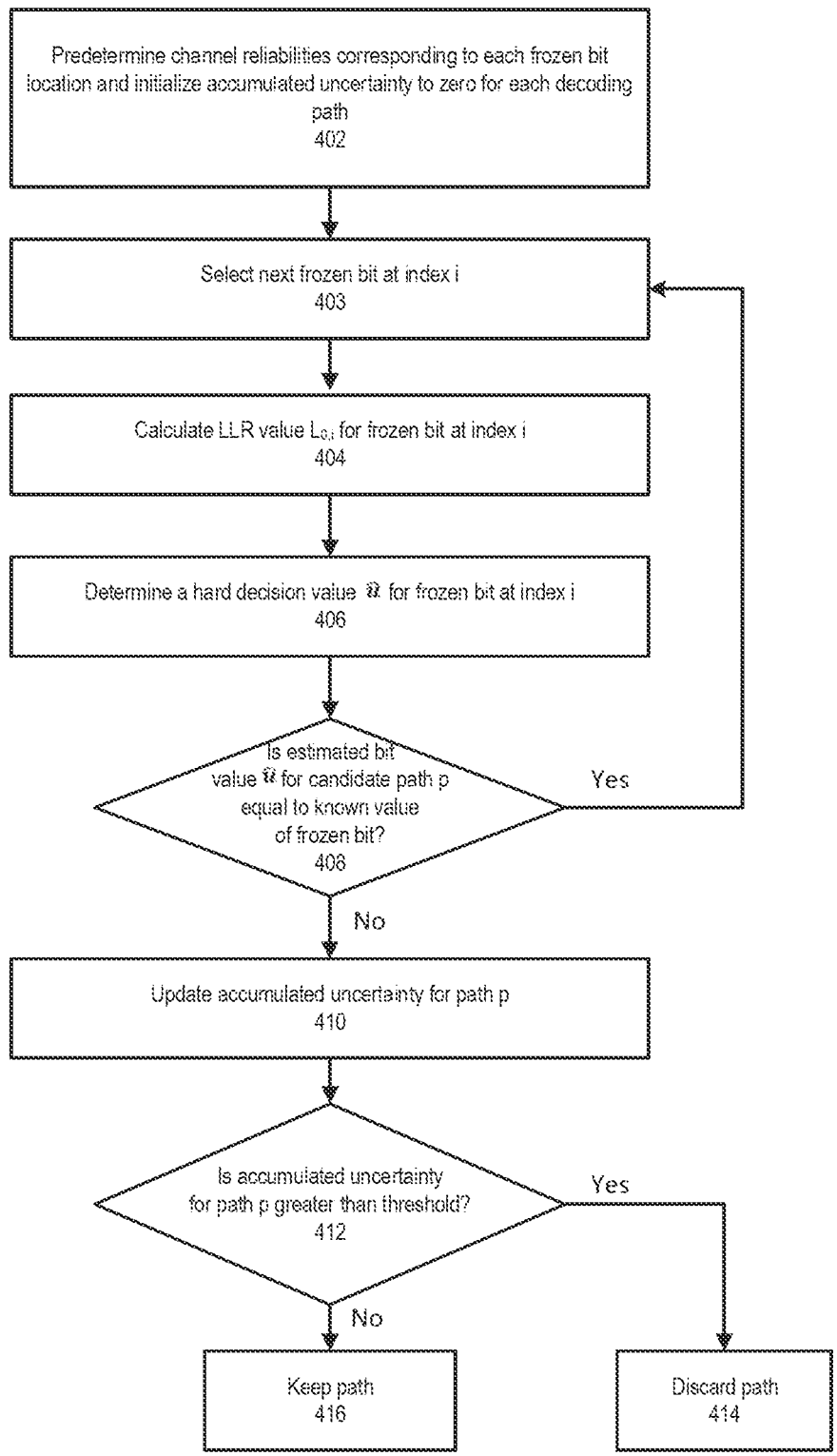
FIG. 4 illustrates a communication system according to an embodiment of the disclosed subject matter.

As noted above, the frozen bits in a polar decoder are fixed and known to both the transmitter and the receiver. During decoding (using either SC or SCL), the LLR values $L_{l,i}$ propagate from the channel LLR values at the right hand side of the decoder, towards the bank of estimated information bits and frozen bits $\hat{u}$ at the left hand side as they are processed using the "f" and "g" equations shown above. When the LLR values reach the nodes at the far left (i.e., the $L_{0,i}$ values), and the nodes correspond to frozen bits, then systems/methods according to some embodiments of the inventive concepts detect decoding errors as shown in FIG. 4.

First, the reliabilities of each frozen and information bit location are predetermined (block 402). For purposes of this example, let $I_i$ denote the reliability value corresponding to the bit location i. An accumulated uncertainty $Z_p$ is initialized to zero for each decoding path $p \in \{1, 2, \ldots, L_{path}\}$ on the list of $L_{path}$ candidate decoding paths.

Assuming the LLR of the frozen node values are not known, the systems/methods then select the next frozen bit at index i (block 403) and calculate LLR value for the given frozen bit at index i (block 404). The systems/methods then determine a hard value $\hat{u}_i$ of the frozen bit using the decision block 12 shown in FIG. 3 (block 406) for each candidate decoding path $p \in \{1, 2, \ldots, L\}$.

Next, for each candidate path, the systems/methods compare $\hat{u}_i$ to the known value of the frozen bit (block 408).

If a misalignment is detected, i.e., if the estimated value of the frozen bit is different from the known value of the frozen bit, for a given path p e $\{1, 2, \ldots, L_{path}\}$, then add some function of the absolute value of the LLR and the reliability $I_i$ of this frozen bit location into the accumulated uncertainty $Z_p$ for that path according to the following equation (block 410):

$$Z_p = Z_p + f(I_i, |LLR_{p,i}|) \quad [5]$$

In one embodiment, the function $f(\ )$ in equation [5] is simply the product of the reliability and the absolute value of the LLR obtained for that frozen bit, i.e. $f(I_i, |LLR_{p,i}|) = I_i \cdot |LLR_{p,i}|$. In another embodiment, $f(\ )$ is simply the absolute value of the LLR: $f(I_i, |LLR_{p,i}|) = |LLR_{p,i}|$. In yet another embodiment, $f(\ )$ is simply the reliability value $I_i$: $f(I_i, |LLR_{p,i}|) = I_i$. In yet another embodiment $f(I_i, |LLR_{p,i}|) = 1$ or any constant value, in which case, the accumulated uncertainty corresponds to the number of frozen bits where the signs of the decoded soft frozen bit values are misaligned with the sign of the known frozen bit values.

Next, the decoder checks to see if the accumulated uncertainty of the candidate decoding path p exceeds certain predetermined threshold $\delta$ (block 412). If so, then the candidate decoding path may be discarded (block 414). Otherwise, the candidate path is kept (block 416), and decoding continues with the remaining candidate paths.

If the accumulated uncertainty for all candidate paths exceeds the threshold, the systems/methods may in some embodiments declare a decoding error and abort the decoding procedure.

In another embodiment, the existing decoding attempt may be aborted, and a new decoding attempt is started using a more powerful decoding algorithm, for example, using a SC list (SCL) decoding algorithm with a larger list size L.

If, at the conclusion of the decoding process, the accumulated uncertainty for at least one candidate path is below the predefined threshold $\delta$, the decoder can declare the decoding a success.

In another embodiment, the step of checking if the accumulated uncertainty of each candidate decoding path exceeds the threshold may be performed on the final list of candidate paths after the SC or SCL decoder finishes decoding. That is, in some embodiments, after the last information or frozen bit is reached, the systems/methods check to see if the accumulated uncertainty of the best candidate decoding path (or alternatively, each candidate decoding path) in the final list exceeds the predetermined threshold δ. If so, then a decoding error may be declared and the decoding procedure aborted, or the current decoding attempt may be aborted, and a new decoding attempt started using a more powerful decoding algorithm, such as a SC list (SCL) decoding algorithm with a larger list size L.

If the accumulated uncertainty is below the predefined threshold δ, the decoder can declare the decoding a success.

Error Detection Via PC Frozen Bits

Some embodiments of the inventive concepts extend the polar code by a precoding step in which a vector of parity check (PC) bits are constructed and used in the encoding and decoding process. The PC bits may be assigned to predetermined frozen bit locations of the u vector. The PC bits are similar to the information bits in that the values of the PC bits are not fixed and known a priori; however, the PC bits can be derived from the information bits. In some embodiments, the PC bits may be selected such that they can be calculated from previously estimated information bits. For example, a PC bit at index i=3 may be calculated from the values of information or PC bits at indices i<3.

The PC bits are similar to the frozen bits in that the PC bits do not directly carry information. The PC bits are sometimes called "PC frozen bits".

Figure 5A:
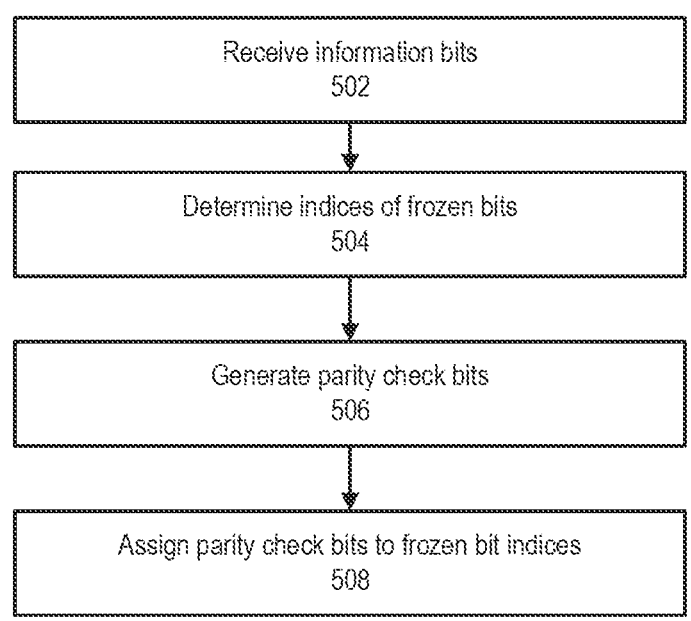
FIGS. 5A, 5B, 6, 7 and 8 are flowcharts that illustrate operations of systems/methods according to some embodiments.

Encoding operations using parity check bits according to some embodiments are illustrated in FIG. 5A. As shown therein, operations of a polar encoder according to some embodiments include receiving information bits for encoding (block 504), determining indices of the frozen bits (block 504). The encoder generates parity bits based on the information bits and/or the frozen bits (block 506) and assigns the parity check bits to the frozen bit locations (block 508).

When using PC-polar according to some embodiments, part of the PC frozen bits can be used for assisting with the decoder, while other PC frozen bits can be used for error detection purpose. For example, a vector of $N_{pf}=20$ PC frozen bits can be generated for an info vector of K bits. Then during decoding, $N_{pf1}=12$ bits can be used to assist the list decoding in pruning candidate paths. The remaining $N_{pf2}=20-12=8$ PC frozen bits can be treated as information bits during the decoding. After the decoding, then the $N_{pf2}$ PC frozen bits can be used to perform error detection as described above.

Note that for a given vector of $N_{pf}$ PC frozen bits, it is up to the decoder implementation to determine how to split it into $N_{pf1}$ sub-vector and the $N_{pf2}$ sub-vector. Larger $N_{pf1}$ provides better error correction performance, but worse error detection performance.

Figure 5B:
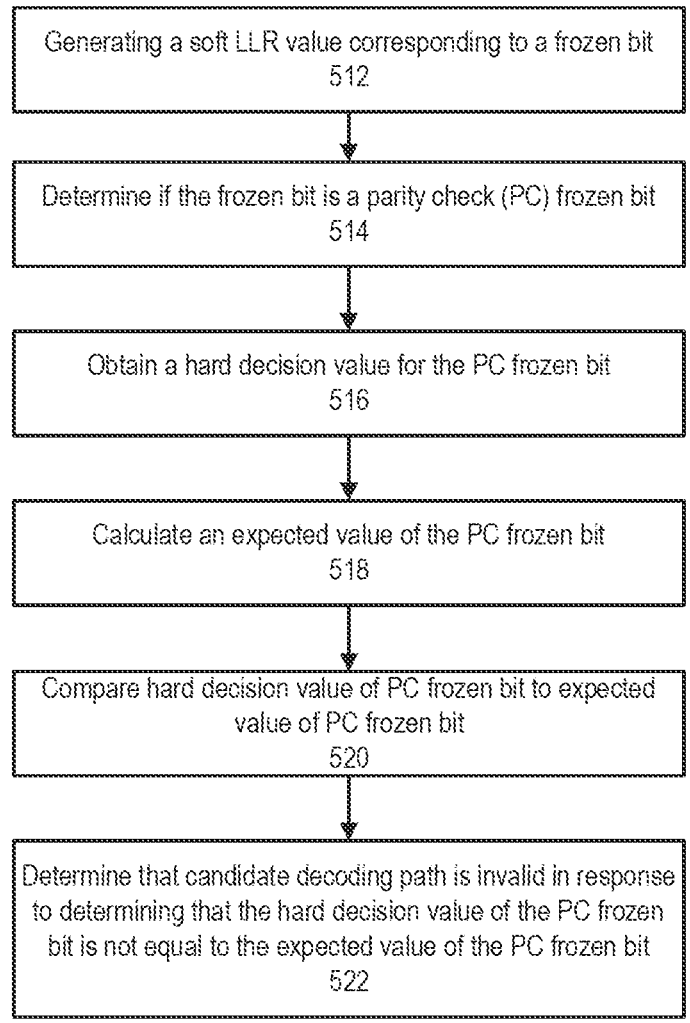

Operations of a polar decoder using parity check frozen bits according to some embodiments are illustrated in FIG. 5B. As shown therein, the operations include, for a given candidate decoding path, generating a soft LLR value corresponding to a frozen bit (block 512), determining if the frozen bit corresponds to a parity check (PC) frozen bit (block 514), obtaining a hard decision value for the PC frozen bit (block 516); calculating an expected value of the PC frozen bit (block 518), comparing the hard decision value of the PC frozen bit to the expected value of the PC frozen bit (block 520), and determining that the candidate decoding path is invalid in response to determining that the hard decision value of the PC frozen bit is not equal to the expected value of the PC frozen bit (block 522).

Error Detection Via Codeword Validation

In some embodiments, an estimated information block may be re-encoded by a polar decoder and compared with the estimated codeword. For example, in the example below, an estimated information block output by a decoder may be re-encoded by the polar decoder to form a re-encoded codeword (codeword_B), and the result may be compared with an estimated codeword (codeword_A) that was input to the decoder to determine if a decoding error has occurred.

Figure 6:
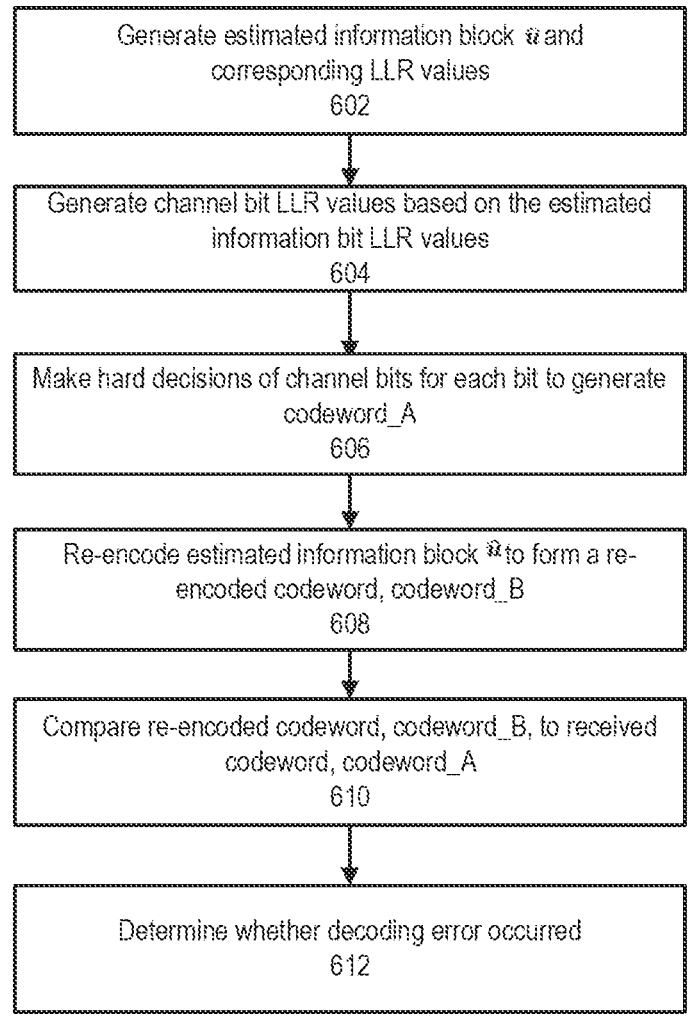

For example, referring to FIGS. 3 and 6, an estimated block of information bits may be generated in the form of a binary vector û and the corresponding LLR values of these information bits that were input to the decision blocks 12 to obtain the estimated block of information bits (block 602).

The systems/methods then generate channel bit LLR values $L_y$, by propagating the LLR values of the information bits (i.e., at left hand side of FIG. 2) to the right hand side of FIG. 2 (block 604). That is, the LLR values corresponding to the estimated information bits it are processed using the polar encoder to obtain a set of encoded LLR values at the right hand side of the encoder.

The systems/methods then make hard decisions on the channel bit for each of the bits transmitted over the channel (block 606). The obtained codeword is referred to as estimated codeword_A.

The systems/methods then take the binary vector û, and encode it into a second codeword, codeword_B, using the polar encoder (block 608).

The systems/methods then perform error detection of the decoder output by comparing codeword_A and codeword_B (block 610) and determining if a decoding error occurred (block 612). If codeword_A is equal to codeword_B, then the decoded codeword is assumed to be correct. However, if codeword_A is not equal to codeword_B, then the decoded codeword is assumed to be incorrect, and a decoding error is declared. The existing decoding attempt may be aborted, and a new decoding attempt may be started, for example, using a more powerful decoding algorithm.

Error Detection Via Syndrome Validation

Some embodiments of the inventive concepts compute a syndrome of the estimated block of information bits through re-encoding. The syndrome may be calculated based on signs of the LLR values of the frozen bits of the estimated block of information bits. The syndrome is compared with the correct known syndrome values (typically zeros) to determine if a decoding error has occurred.

Figure 7:
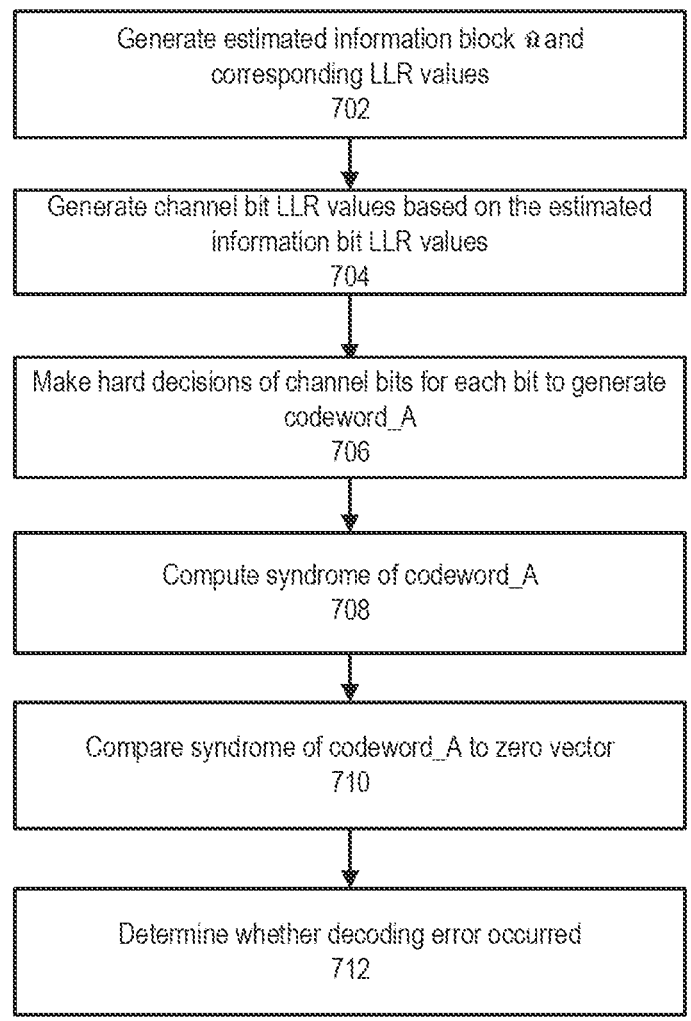

FIG. 7 illustrates operations of systems/methods according to some embodiments. As shown therein, the systems/methods may generate the estimated information block, binary vector U (block 702).

The systems/methods may then generate channel bit LLR values $L_y$, by propagating the LLR values from left hand side to right hand side of the encoder of FIG. 2 (block 704).

The systems/methods may then make hard decisions on the channel bit for each of the bit transmitted over the channel (block 706). The obtained codeword is referred to as the estimated codeword_A of length N.

The systems/methods may then compute the (N−K)-bit syndrome of codeword_A, where K is the number of information bits in the codeword (block 708). One possible method of computing the syndrome is to feed codeword_A as input into the polar encoder and extract the syndrome from its output based on the bit-reversed indices of the known frozen bit locations.

The systems/methods then compare the syndrome of codeword_A to an all-zero vector of the same length (block 710) to determine if a decoding error occurred (block 712).

If the syndrome is equal to the zero vector, then the decoded codeword is assumed to be correct. However, if the syndrome is not equal to the zero vector, then the decoded codeword is assumed to be incorrect, and a decoding error is declared.

Note that the method of computing syndrome of a codeword described above is possible because the syndrome of a Polar codeword can be obtained by re-encoding the encoded codeword.

Communication Systems and Devices

Embodiments of the disclosed subject matter, such as any of the above-described methods and/or apparatuses configured to perform such methods, may be implemented in any appropriate type of communication system supporting any suitable communication standards and using any suitable components. As one example, certain embodiments may be implemented in a communication system such as that illustrated in FIG. 4. Although certain embodiments are described with respect to LTE systems and related terminology, the disclosed concepts are not limited to LTE or a 3GPP system. Additionally, although reference may be made to the term "cell", the described concepts may also apply in other contexts, such as beams used in Fifth Generation (5G) systems, for instance.

Figure 8:
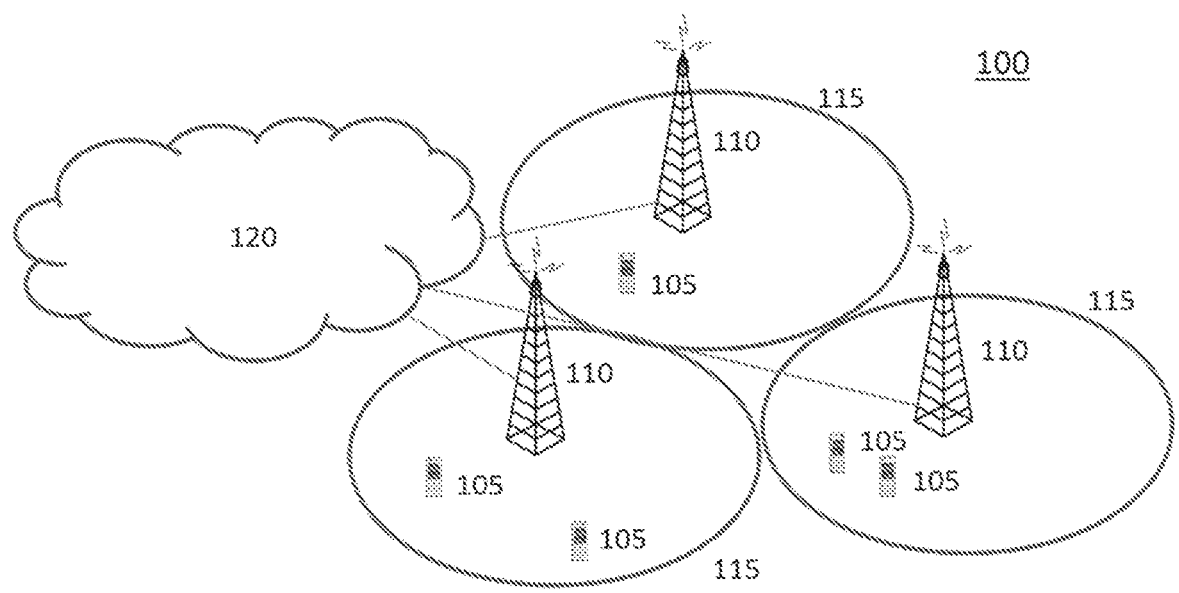

Referring to FIG. 8, a communication system 100 comprises a plurality of wireless communication devices 105 (e.g., UEs, machine type communication [MTC]/machine-to-machine [M2M] UEs) and a plurality of radio access nodes 110 (e.g., eNodeBs or other base stations). Communication system 100 is organized into cells 115, which are connected to a core network 120 via corresponding radio access nodes 110. Radio access nodes 110 are capable of communicating with wireless communication devices 105 along with any additional elements suitable to support communication between wireless communication devices or between a wireless communication device and another communication device (such as a landline telephone).

Figure 9A:
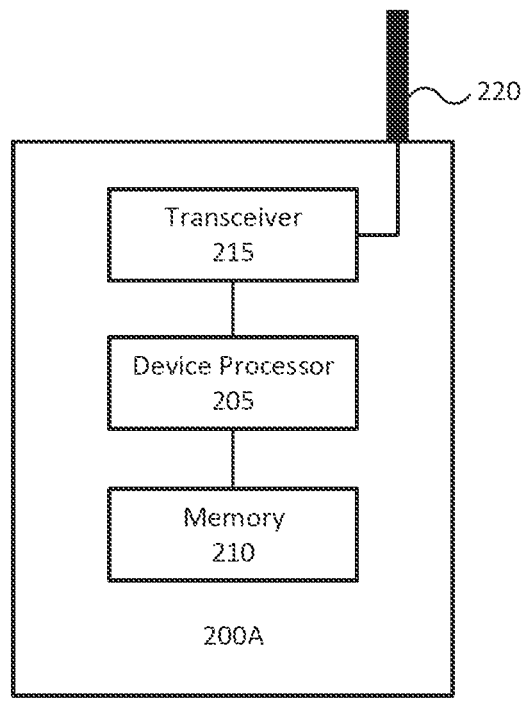
FIG. 9A illustrates a wireless communication device according to an embodiment of the disclosed subject matter.
Figure 9B:
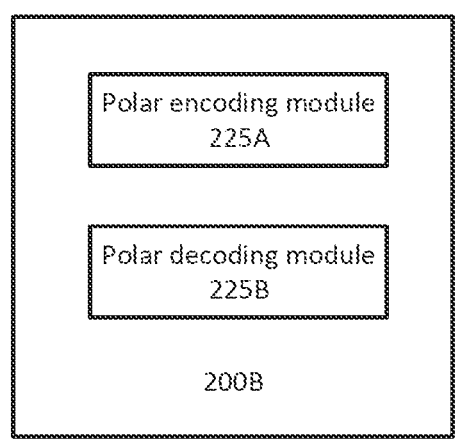
FIG. 9B illustrates a wireless communication device according to another embodiment of the disclosed subject matter.

Although wireless communication devices 105 may represent communication devices that include any suitable combination of hardware and/or software, these wireless communication devices may, in certain embodiments, represent devices such as those illustrated in greater detail in FIGS. 9A and 9B. Similarly, although the illustrated radio access node may represent network nodes that include any suitable combination of hardware and/or software, these nodes may, in particular embodiments, represent devices such those illustrated in greater detail by FIGS. 10A, 10B and 11.

Referring to FIG. 9A, a wireless communication device 200A includes a processor 205 (e.g., Central Processing Units [CPUs], Application Specific Integrated Circuits [ASICs], Field Programmable Gate Arrays [FPGAs], and/or the like), a memory 210, a transceiver 215, and an antenna 220. In certain embodiments, some or all of the functionality described as being provided by UEs, MTC or M2M devices, and/or any other types of wireless communication devices may be provided by the device processor executing instructions stored on a computer-readable medium, such as memory 210. Alternative embodiments may include additional components beyond those shown in FIG. 9A that may be responsible for providing certain aspects of the device's functionality, including any of the functionality described herein.

Referring to FIG. 9B, a wireless communication device 200B comprises at least one module 225 configured to perform one or more corresponding functions. Examples of such functions include various method steps or combinations of method steps as described herein with reference to wireless communication device(s). In general, a module may comprise any suitable combination of software and/or hardware configured to perform the corresponding function. For instance, in some embodiments a module comprises software configured to perform a corresponding function when executed on an associated platform, such as that illustrated in FIG. 9A. In particular, the wireless communication device 200B may include a polar encoding module 225A that is configured to implement a polar encoder as described above and a polar decoding module 225B that is configured to implement a polar decoder as described above.

Figure 10A:
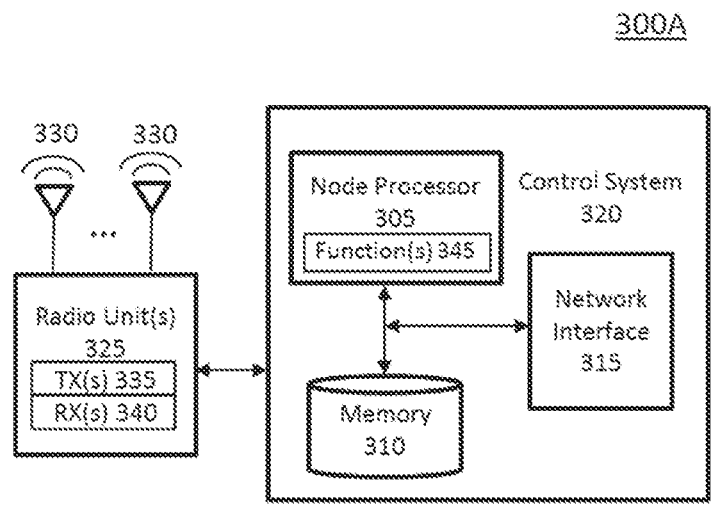
FIG. 10A illustrates a radio access node according to an embodiment of the disclosed subject matter.

Referring to FIG. 10A, a radio access node 300A comprises a control system 320 that comprises a node processor 305 (e.g., Central Processing Units (CPUs), Application Specific Integrated Circuits (ASICs), Field Programmable Gate Arrays (FPGAs), and/or the like), memory 310, and a network interface 315. In addition, radio access node 300A comprises at least one radio unit 325 comprising at least one transmitter 335 and at least one receiver coupled to at least one antenna 330. In some embodiments, radio unit 325 is external to control system 320 and connected to control system 320 via, e.g., a wired connection (e.g., an optical cable). However, in some other embodiments, radio unit 325 and potentially the antenna 330 are integrated together with control system 320. Node processor 305 operates to provide at least one function 345 of radio access node 300A as described herein. In some embodiments, the function(s) are implemented in software that is stored, e.g., in the memory 310 and executed by node processor 305.

In certain embodiments, some or all of the functionality described as being provided by a base station, a node B, an eNodeB, and/or any other type of network node may be provided by node processor 305 executing instructions stored on a computer-readable medium, such as memory 310 shown in FIG. 10A. Alternative embodiments of radio access node 300 may comprise additional components to provide additional functionality, such as the functionality described herein and/or related supporting functionality.

Figure 10B:
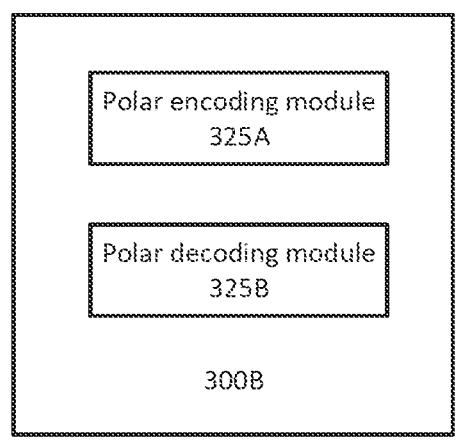
FIG. 10B illustrates a radio access node according to another embodiment of the disclosed subject matter.

Referring to FIG. 10B, a radio access node 300B comprises at least one module 350 configured to perform one or more corresponding functions. Examples of such functions include various method steps or combinations of method steps as described herein with reference to radio access node(s). In general, a module may comprise any suitable combination of software and/or hardware configured to perform the corresponding function. For instance, in some embodiments a module comprises software configured to perform a corresponding function when executed on an associated platform, such as that illustrated in FIG. 10A. In particular, the radio access node 3200B may include a polar encoding module 325A that is configured to implement a polar encoder as described above and a polar decoding module 325B that is configured to implement a polar decoder as described above.

Figure 11:
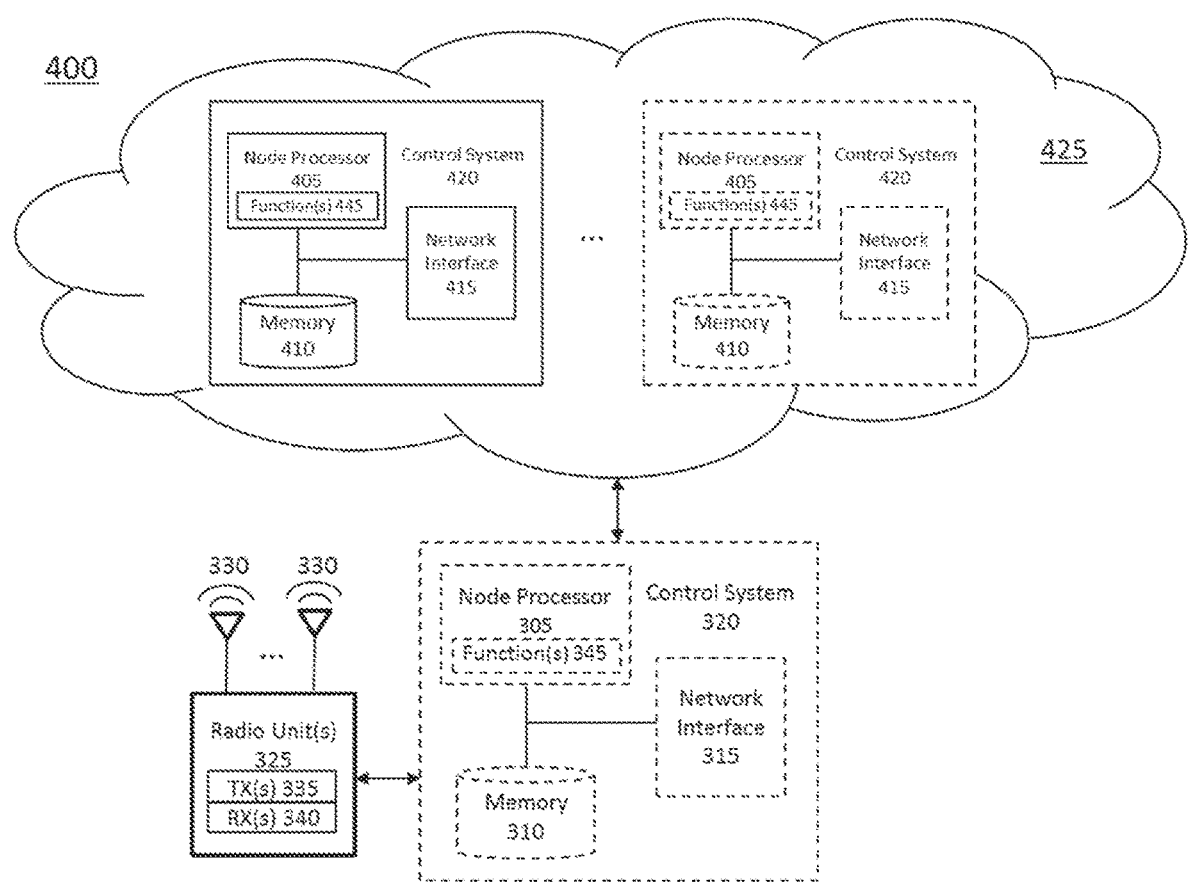
FIG. 11 illustrates a radio access node according to yet another embodiment of the disclosed subject matter.

FIG. 11 is a block diagram that illustrates a virtualized radio access node 400 according to an embodiment of the disclosed subject matter. The concepts described in relation to FIG. 7 may be similarly applied to other types of network nodes. Further, other types of network nodes may have similar virtualized architectures. As used herein, the term "virtualized radio access node" refers to an implementation of a radio access node in which at least a portion of the functionality of the radio access node is implemented as a virtual component(s) (e.g., via a virtual machine(s) executing on a physical processing node(s) in a network(s)).

Referring to FIG. 11, radio access node 400 comprises control system 320 as described in relation to FIG. 10A.

Control system 320 is connected to one or more processing nodes 420 coupled to or included as part of a network(s) 425 via network interface 315. Each processing node 420 comprises one or more processors 405 (e.g., CPUs, ASICs, FPGAs, and/or the like), memory 410, and a network interface 415.

In this example, functions 345 of radio access node 300A described herein are implemented at the one or more processing nodes 420 or distributed across control system 320 and the one or more processing nodes 420 in any desired manner. In some embodiments, some or all of the functions 345 of radio access node 300A described herein are implemented as virtual components executed by one or more virtual machines implemented in a virtual environment(s) hosted by processing node(s) 420. As will be appreciated by one of ordinary skill in the art, additional signaling or communication between processing node(s) 420 and control system 320 is used in order to carry out at least some of the desired functions 345. As indicated by dotted lines, in some embodiments control system 320 may be omitted, in which case the radio unit(s) 325 communicate directly with the processing node(s) 420 via an appropriate network interface (s).

In some embodiments, a computer program comprises instructions which, when executed by at least one processor, causes at least one processor to carry out the functionality of a radio access node (e.g., radio access node 110 or 300A) or another node (e.g., processing node 420) implementing one or more of the functions of the radio access node in a virtual environment according to any of the embodiments described herein.

As will be apparent to those of ordinary skill in the art, in the above-described methods the described steps may be performed in conjunction with additional steps that may or may not be specifically mentioned in context, such as obtaining (e.g., receiving, accessing, determining, calculating, etc.) specified information, sending (e.g., transmitting, transferring, etc.) specified information, and so on.

While the disclosed subject matter has been presented above with reference to various embodiments, it will be understood that various changes in form and details may be made to the described embodiments without departing from the overall scope of the disclosed subject matter.

What is claimed is:

1. A method of decoding a polar coded signal, the method comprising:
    determining channel reliabilities for a plurality of polar coded bit channels in a data communication system including a plurality of frozen bit channels and non-frozen bit channels;
    selecting a frozen bit channel of the plurality of frozen bit channels;
    calculating a likelihood value for a bit estimate associated with the frozen bit channel;
    generating a hard decision value for the bit estimate in response to the likelihood value;
    comparing the hard decision value for the bit estimate to a known value of a frozen bit transmitted on the frozen bit channel;
    in response to determining that the hard decision value for the bit estimate differs from the known value of the frozen bit transmitted on the frozen bit channel, updating an accumulated uncertainty;
    comparing the accumulated uncertainty to a threshold; and
    determining that a decoding error has occurred in response to the comparison of the accumulated uncertainty to the threshold.

2. The method of claim 1, wherein the likelihood value comprises a log likelihood value.

3. The method of claim 1, further comprising repeating steps of:
    (a) selecting a frozen bit channel of the plurality of frozen bit channels;
    (b) calculating a likelihood value for a bit estimate associated with the frozen bit channel;
    (c) generating a hard decision value for the bit estimate in response to the likelihood value;
    (d) comparing the hard decision value for the bit estimate to a known value of a frozen bit transmitted on the frozen bit channel; and
    (e) in response to determining that the hard decision value for the bit estimate differs from the known value of the frozen bit transmitted on the frozen bit channel, updating an accumulated uncertainty;
    for each of a plurality of candidate decoding paths.

4. The method of claim 3, further comprising:
    discarding any candidate decoding path for which the accumulated uncertainty exceeds a predetermined threshold.

5. The method of claim 4, further comprising:
    determining any candidate decoding paths remain after discarding the candidate decoding path; and
    in response to determining that no candidate decoding paths remain, aborting a decoding procedure.

6. The method of claim 1, wherein updating the accumulated uncertainty comprises updating the accumulated uncertainty based on a reliability of the selected frozen bit channel and the likelihood value for the bit estimate according to the formula:

$$Z_p = Z_p + f(I_i, |LLR_{p,i}|)$$

where $Z_p$ is the accumulated uncertainty, $I_i$ is the reliability of the selected frozen bit channel and $LLR_{p,i}$ is the likelihood value for the bit estimate,
wherein $f(I_i, |LLR_{p,i}|)$ is one of:
    equal to $I_i$,
    equal to a constant,
    equal to one,
    given by the equation $f(I_i, |LLR_{p,i}|) = I_i \cdot |LLR_{p,i}|$, or
    given by the equation $f(I_i, |LLR_{p,i}|) = |LLR_{p,i}|$.

7. The method of claim 1, further comprising, in response to determining that the decoding error has occurred, one of:
    aborting a decoding procedure, or
    restarting the decoding procedure using a more powerful decoding algorithm.

8. The method of claim 1, wherein the frozen bit is a parity bit, the method further comprising:
    generating an expected parity value of the frozen bit based on a previously decoded bit estimate; and
    determining that the decoding error has occurred if the estimated value of the frozen bit does not correspond to the expected parity value of the frozen bit.

9. The method of claim 8, further comprising discarding a current decoding path in response to determining that the estimated value of the frozen bit does not correspond to the expected parity value of the frozen bit.

10. A communication device, comprising:

a processor; and a memory containing instructions that, when executed by the processor, cause the communication device to decode a polar coded signal by carrying out a method, the method comprising:

determining channel reliabilities for a plurality of polar coded bit channels in a data communication system including a plurality of frozen bit channels and non-frozen bit channels;

selecting a frozen bit channel of the plurality of frozen bit channels;

calculating a likelihood value for a bit estimate associated with the frozen bit channel;

generating a hard decision value for the bit estimate in response to the likelihood value;

comparing the hard decision value for the bit estimate to a known value of a frozen bit transmitted on the frozen bit channel;

in response to determining that the hard decision value for the bit estimate differs from the known value of the frozen bit transmitted on the frozen bit channel, updating an accumulated uncertainty;

comparing the accumulated uncertainty to a threshold; and determining that a decoding error has occurred in response to the comparison of the accumulated uncertainty to the threshold.

* * * * *